United States Patent
Kang

(10) Patent No.: US 6,239,396 B1
(45) Date of Patent: May 29, 2001

(54) SEMICONDUCTOR DEVICE HANDLING AND SORTING APPARATUS FOR A SEMICONDUCTOR BURN-IN TEST PROCESS

(75) Inventor: Ju-il Kang, Chungcheongnam-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/275,733

(22) Filed: Mar. 24, 1999

(30) Foreign Application Priority Data

Aug. 7, 1998 (KR) .................................. 98-32254

(51) Int. Cl.[7] .................................................. B07C 5/344
(52) U.S. Cl. ........................ 209/573; 209/933; 324/158.1
(58) Field of Search .................... 209/571, 573, 209/922, 934, 933; 324/158.1; 414/222, 225, 404, 416

(56) References Cited

U.S. PATENT DOCUMENTS

| | | | |
|---|---|---|---|
| 3,662,881 | * 5/1972 | Fineran | 209/655 |
| 4,128,174 | * 12/1978 | Frisbie et al. | 209/573 |
| 4,348,276 | * 9/1982 | Tateishi et al. | 209/573 |
| 4,871,963 | * 10/1989 | Cozzi | 324/158.1 X |
| 4,908,126 | * 3/1990 | Willberg et al. | 209/573 |
| 5,230,432 | * 7/1993 | Sugai | 324/158.1 X |
| 5,848,705 | * 12/1998 | Gianpaolo et al. | 209/573 X |
| 5,865,319 | * 2/1999 | Okuda et al. | 209/571 X |

FOREIGN PATENT DOCUMENTS

| | | | |
|---|---|---|---|
| 6-9007 | * 1/1994 | (JP) | 209/573 |
| 92/04989 | * 4/1992 | (WO) | 209/573 |

* cited by examiner

Primary Examiner—Tuan N. Nguyen
(74) Attorney, Agent, or Firm—Skjerven Morrill MacPherson LLP; David W. Heid

(57) ABSTRACT

An apparatus in accordance with the present invention includes separate transporting units respectively for good and rejected semiconductor devices. As a result, respective handlings of the rejected and good devices, such as loading of the good devices into a burn-in board or an unloading tray and loading of the rejected devices into a rejecting tray, can be performed separately without interfering each other.

20 Claims, 5 Drawing Sheets

SEMICONDUCTOR DEVICE HANDLING AND SORTING APPARATUS FOR A SEMICONDUCTOR BURN-IN TEST PROCESS

BACKGROUND OF THE INVENTION

1. Field of the Invention

The present invention relates to a semiconductor burn-in process and, more particularly, to an apparatus for inserting, removing, and sorting semiconductor devices according to the results of tests.

2. Description of the Related Art

In order to identify devices that are likely to fail in their early life, semiconductor devices after fabrication undergo testing or screening that applies electrical and thermal stresses to the devices and identifies devices having the potential for early failure. Generally, a process for screening the semiconductor devices is called a "semiconductor device burn-in test."

A monitoring burn-in test (MBT) chamber for the burn-in tests requires a semiconductor device handling and sorting apparatus or system which sorts semiconductor devices in accordance with the burn-in test results. The apparatus inserts semiconductor devices into a burn-in board for testing, removes tested semiconductor devices from the burn-in board, and sorts the tested semiconductor devices into good and failed categories. Such an apparatus typically includes various tools for rapidly performing the sorting operation.

For example, one conventional device handling and sorting apparatus includes a centering pocket unit, a DC test unit and a carrier pocket unit disposed in line on a stage of the apparatus. A burn-in board containing tested semiconductor devices thereon is disposed under the stage. A center portion of the stage has an opening so that the burn-in board moving in an XY-plane under the stage can be accessed through the opening. Thus, the burn-in board can be smoothly positioned for operations connected with various tools on the stage. Multiple transportation tools, which are driven by a driving cylinder, are in respective upper portions of the centering pocket unit, the DC test unit and the carrier pocket unit. The transportation tools transport the semiconductor devices rapidly and stably between the units.

In the conventional apparatuses such as described above, when a burn-in board having the burn-in tested semiconductor devices thereon is loaded to a lower portion of a stage, a transportation tool removes the semiconductor devices from the burn-in board and loads the semiconductor devices on the carrier pocket unit. From the carrier pocket unit, the transportation tool transports only good devices to an unloading tray positioned at an unloading terminal unit. Then, the carrier pocket unit which contains the remaining failed devices moves toward a rear portion of the stage, sorts the remaining failed devices into several levels, and loads the devices on burn-in rejecting trays according to the levels.

In order to prepare a semiconductor device for a burn-in test, a transportation tool loads the semiconductor device from a loading tray on a loading terminal to the centering pocket unit, aligns the semiconductor device, and transports the aligned semiconductor device to a DC test unit for a DC test of the semiconductor device prior to inserting the semiconductor device into a burn-in board. If the semiconductor device passes the DC test, the transportation tool plugs the semiconductor device into the burn-in board. However, if the semiconductor device fails the DC test, the transportation tool loads the semiconductor device into a DC rejecting tray. The DC rejecting tray is in the vicinity of an XY-table positioned under the stage, and moves in XY-plane under the stage so as to receive the DC test-rejected semiconductor devices.

To summarize, after unloading and sorting the semiconductor devices that are burn-in tested in the MBT chamber, the device handling and sorting apparatus loads semiconductor devices that passed the DC-test into an empty burn-in board and transports the burn-in board loaded with semiconductor devices to the MBT chamber for a new burn-in test.

Conventional device handling and sorting apparatuses have some problems. For example, burn-in tests and sorting of the semiconductor devices into good product or failures according to the results of the DC test are performed simultaneously. Therefore, respective tools related to good devices and rejected devices can collide because the tools move on the same operation line. In addition, an operation of the burn-in rejecting trays requires an XY-robot in addition to a robot that operates the transporting tools. The use of the two robots may complicate control of the apparatus, so that unexpected operation errors may occur. Moreover, operation of the DC rejecting trays may aggravate the operation errors. If the XY-table moves too frequently, a small impact can pop the semiconductor devices in the DC rejecting trays out of the DC rejecting trays. Further, a transportation tool may wait for a considerable time above the stage until the DC rejecting trays are properly positioned. As a result, overall operating efficiency of the apparatus is lowered.

SUMMARY OF THE INVENTION

An embodiment of the present invention provides a semiconductor device handling and sorting apparatus. The apparatus transports the semiconductor devices rejected from DC and burn-in tests separately from a main operation of the apparatus and without using an XY-robot and XY-table. The apparatus is not forced to wait for an aligned positioning of the DC rejecting trays before loading the rejected devices to the trays, so that the operating efficiency of the apparatus is high. In short, an overall architecture of the apparatus is simple and increases the operating efficiency of the apparatus.

In one embodiment, the apparatus includes separate device handling units respectively for good and rejected semiconductor devices. Further, a DC rejecting tray and a burn-in rejecting tray are integrated and disposed in the vicinity of a stage, so that the integrated DC and burn-in rejecting tray moves on a movable plate near the stage. Here, transportation paths of semiconductor devices are perpendicular to a path of the movable plate.

The apparatus further includes a DC test unit and a carrier pocket unit disposed to move back and forth on the stage. The DC test unit and a carrier pocket unit move to the back of the stage when the units are to unload rejected devices. Accordingly, a transportation path of the rejected devices is separated from a transportation path of the good devices.

As a result, respective subsequent handling of the rejected and good devices, such as loading of the good devices in a burn-in board or an unloading tray and loading of the rejected devices into a rejecting tray, can be performed simultaneously without interfering each other.

BRIEF DESCRIPTION OF THE DRAWINGS

The present invention will be made more apparent by describing in specific embodiments thereof with reference to the accompanying drawings, in which.

Use of the same reference symbols in different figures indicates similar or identical items.

DETAILED DESCRIPTION OF THE PREFERRED EMBODIMENTS

The present invention is described more fully hereinafter with reference to the accompanying drawings, in which embodiments of the invention are shown.

Figure 1:
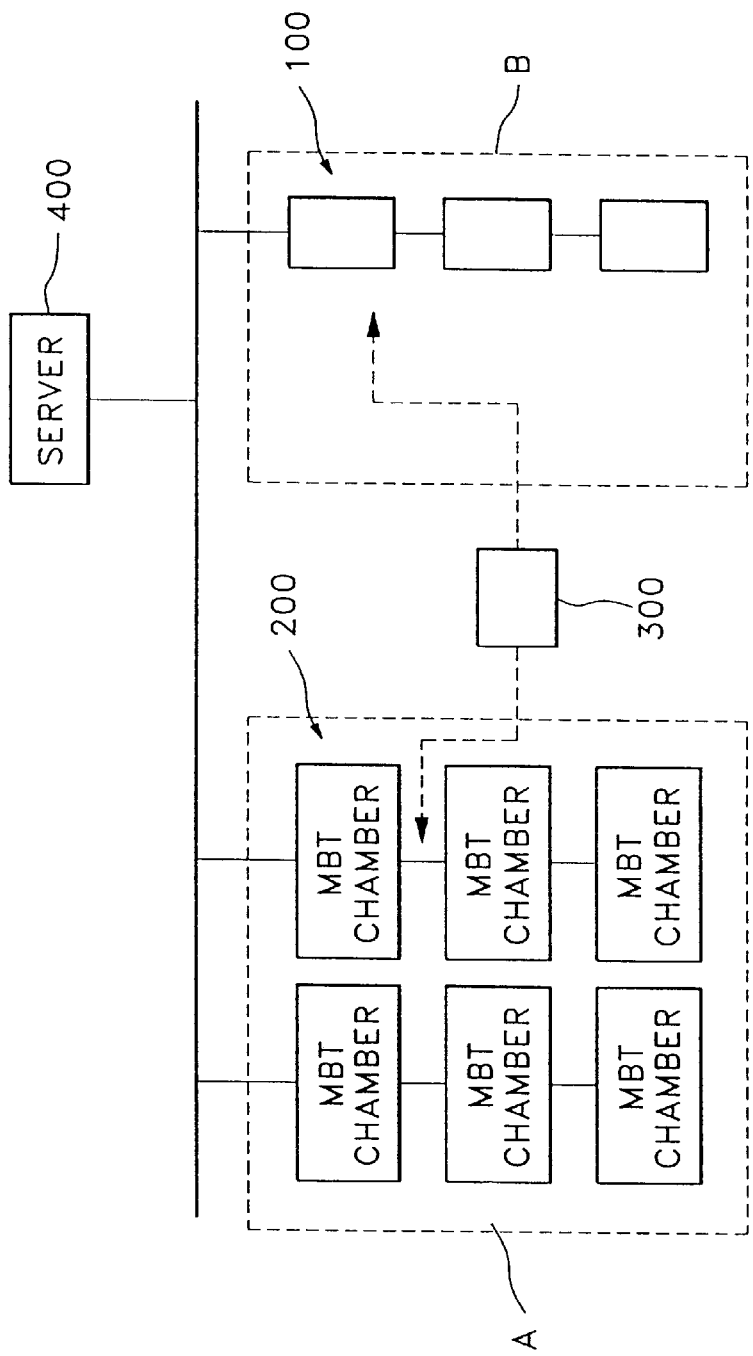
FIG. 1 is a diagram of a semiconductor burn-in test system according to an embodiment of the present invention.

As shown in FIG. 1, a semiconductor device burn-in test system in accordance with an embodiment of the present invention includes a server 400, a group of MBT chambers 200 and a group of semiconductor device handling and sorting apparatuses 100. Both MBT chambers 200 and apparatuses 100 are in communication with server 400.

MBT chambers 200 burn-in test semiconductor devices by applying thermal and electrical stresses to the semiconductor devices. The apparatuses 100 insert the semiconductor devices to burn-in boards before the burn-in tests, and, after the tests, remove the semiconductor devices from the burn-in boards and sort the devices according to the burn-in test results, as good or failed (rejected).

A carrying means, for example, a handcart or an automatic guided vehicle (AGV) 300 delivers to MBT chambers 200 a rack (not shown) containing the burn-in boards having semiconductor devices loaded thereon. After loading a burn-in board in an MBT chamber 200, the MBT chamber 200 burn-in tests the semiconductor devices on the burn-in board, sends a test result to server 400, and unloads the burn-in board. Then, AGV 300 delivers the tested burn-in boards in the rack to semiconductor device handling apparatus 100. Each apparatus 100 downloads the test results from server 400, removes the semiconductor devices from the burn-in board, and sorts the devices according to the test results.

Figure 2:
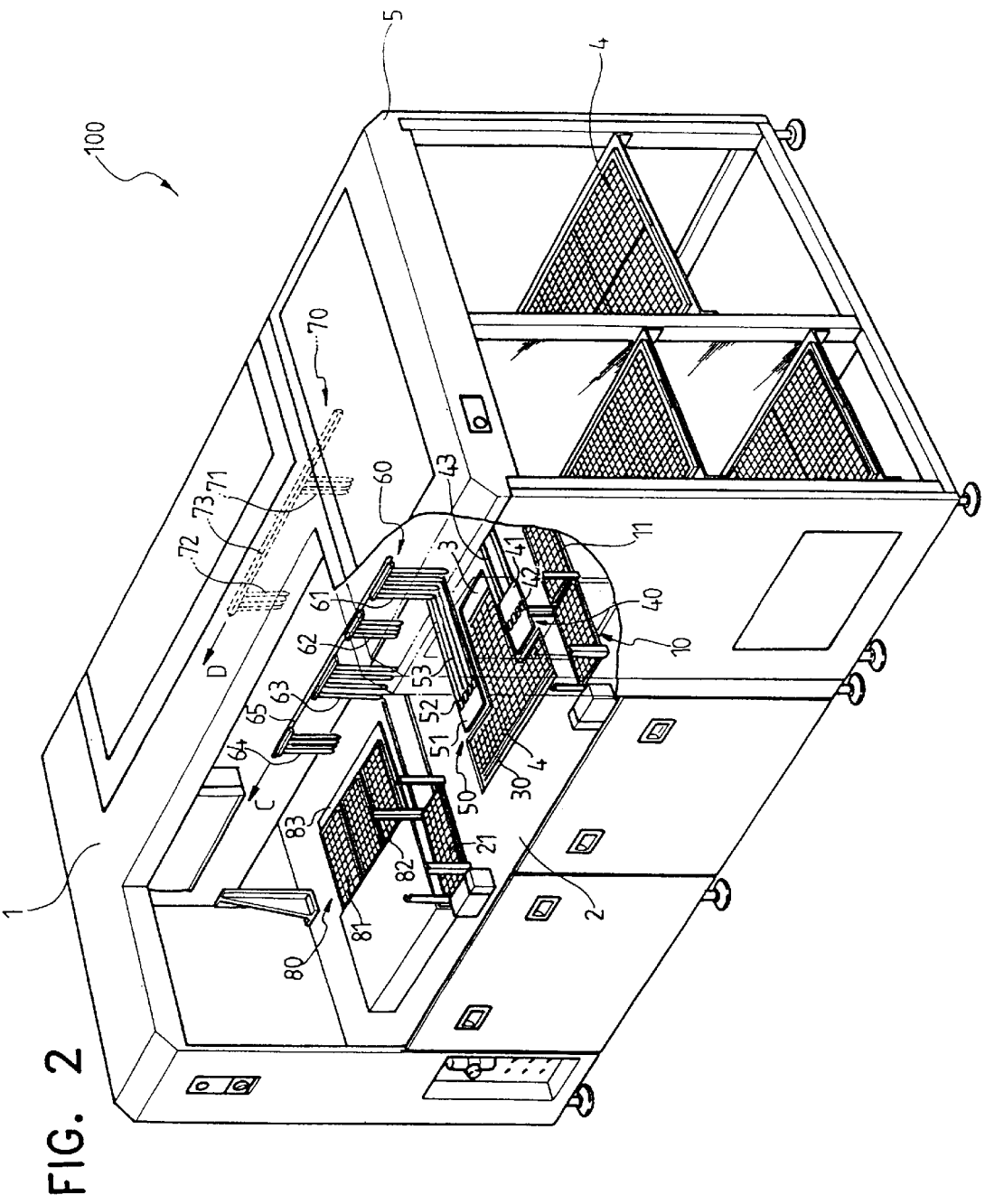
FIG. 2 is a perspective view of a semiconductor device handling and sorting apparatus of a semiconductor burn-in process according to an embodiment of the present invention.

As shown in FIG. 2, a semiconductor device handling and sorting apparatus according to an embodiment of the present invention includes a main body 1 and a burn-in board elevator 5. Apparatus 100 further includes on a stage 2 tools for sorting good or rejected semiconductor devices. The tools include a loading terminal unit 10, an unloading terminal unit 20, a DC test unit 40, a carrier pocket unit 50, a rejecting tray unit 80, a good device handling unit 60, and a rejected device handling unit 70.

A burn-in board 4 conveyed from MBT chamber 200 is loaded onto a burn-in board elevator 5 coupled to main body 1. Then, burn-in board elevator 5 elevates burn-in board 4 to a relevant position and loads burn-in board 4 to a lower portion of main body 1. Stage 2 has an opening 3 for exposing burn-in board 4.

Loading terminal unit 10 is disposed on one side of stage 2, for example, at a right front side of stage 2, so that to-be-tested semiconductor devices are loaded to loading terminal unit 10 from a loading tray 11.

In contrast, unloading terminal unit 20 is disposed on the other side of stage 2, for example, at a left front of stage 2. Opening 3 is disposed between unloading terminal unit 20 and loading terminal unit 10. Unloading trays 21 in unloading terminal unit 20 wait for the DC and burn-in tested semiconductor packages.

DC test unit 40 is disposed between loading terminal unit 10 and opening 3 and performs DC tests on the semiconductor devices from loading tray 11. DC test unit 40 includes a movable base 41 and multiple DC sockets 42 fixed on movable base 41. Movable base 41 electrically connects to a DC test controller (not shown) placed under stage 2, and moves along a guide 43 formed on stage 2. DC sockets 42 fixed on movable base 41 also electrically connect to the DC test controller via movable base 41.

A device handling unit, which is described further below, loads semiconductor devices to DC sockets 42, and the DC-test controller tests the devices using a DC-test program.

Preferably, four DC sockets 42 are fixed on movable base 41 so as to be suitable for a four para-mode for parallel DC testing of devices.

If any device in sockets 42 fails the DC test, movable base 41 moves to a rear of stage 2 along guide 43 to separate the semiconductor devices that failed the DC test from the semiconductor devices that passed the DC test.

An XY-table unit 30, which is movable along X and Y axes, is under opening 3 of stage 2. When burn-in board 4 is loaded under stage 2, burn-in board 4 is placed on XY-table unit 30, and XY-table unit 30 moves in the XY-plane to position burn-in board 4 for semiconductor device insertion or removal.

Carrier pocket unit 50, which selects the paths of the semiconductor devices in burn-in board 4 according to the results of a burn-in test, is between unloading terminal unit 20 and opening 3. Carrier pocket unit 50 includes multiple carrier pockets 52 disposed on a fixed base 51. Carrier pockets 52 move along guides 53 formed on fixed base 51.

The burn-in tested semiconductor devices are loaded to carrier pockets 52 by a device handling unit which is described below, and then carrier pockets 52 move according to the burn-in test results. For example, when containing the semiconductor devices that failed the burn-in test, carrier pockets 52 move to a rear of fixed base 51 along guide 53 to separate the rejected devices from the semiconductor devices that passed the burn-in test.

Carrier pockets 52 move independently one another. For example, if only one of carrier pockets 52 contains a rejected semiconductor device and the other carrier pockets 52 contain good semiconductor devices, the pocket 52 containing the rejected semiconductor device moves to the rear while the other pockets 52 remain. Preferably, four carrier pockets 52 are on fixed base 51 for a four para-mode.

Rejecting tray unit 80, which sorts the rejected semiconductor devices into several categories and loads the devices into rejecting trays, is disposed in the vicinity of unloading terminal unit 20. Rejecting tray unit 80 includes a movable plate 83, a burn-in rejecting tray 81 and a DC rejecting tray 82. Burn-in rejecting tray 81 and DC rejecting tray 82 are placed on movable plate 83, which moves on stage 2 driven by a cylinder (not shown) formed on stage 2. Burn-in rejecting tray 81 receives according to failure modes the rejected semiconductor devices from the burn-in test. For example, four burn-in rejecting trays 81 can be prepared for four failure modes. DC rejecting tray 82 receives the rejected semiconductor devices from the DC test.

Good device handling unit 60, which is in the upper front portion of stage 2, inserts in or removes from loading tray 11, DC test unit 40, burn-in board 4, carrier pocket unit 50, and unloading tray 21 the good semiconductor devices as identified from the DC test and burn-in test. Good device handling unit 60 moves along a main operation line C of FIG. 2, so as to move right and left over loading tray 11, DC test unit 40, burn-in board 4, carrier pocket unit 50, and unloading tray 21 which are arrayed in line.

In addition, rejected device handling unit 70 is disposed in an upper rear of stage 2 to move the rejected semiconductor devices from DC test unit 40 and carrier pocket unit 50 to rejecting tray unit 80, when DC test unit 40 and carrier pocket unit 50 with the rejected semiconductor devices move to the rear of stage 2. Rejected device handling unit 70 moves right and left in the rear of stage 2 in a direction that is perpendicular to the direction in which rejecting tray unit 80 moves. The operation line of rejected device handling unit 70 is separated from the main operation line C of good device handling unit 60.

Good device handling unit 60 includes a first good device handling arm 61 disposed to move right and left in the upper front of stage 2 corresponding to loading tray 11, a second good device handling arm 62 disposed to move right and left in the upper front of stage 2 corresponding to DC test unit 40, a third good device handling arm 63 disposed to move right and left in the upper front of stage 2 corresponding to burn-in board 4, and a fourth good device handling arm 64 disposed to move right and left in the upper front of stage 2 corresponding to carrier pocket unit 50.

First good device handling arm 61 removes the semiconductor devices from loading tray 11 and inserts the devices to DC test unit 40. Second good device handling arm 62 removes the semiconductor devices from DC test unit 40 and inserts the devices that passed a DC test to burn-in board 4 disposed under stage 2. Third good device handling arm 63 removes the burn-in tested semiconductor devices from burn-in board 4 and inserts the devices to carrier pocket unit 50. Fourth good device handling arm 64 removes the semiconductor devices that passed a burn-in test from carrier pocket unit 50 and inserts the devices to unloading tray 21 disposed on stage 2. First to fourth arms 61, 62, 63 and 64 are supported and driven by a common transportation shaft 65, so that the semiconductor devices can be quickly inserted to or removed from loading tray 21, DC test unit 40, burn-in board 4, carrier pocket unit 50 and unloading tray 21. As a result, good device handling unit 60 transports good semiconductor devices along main operation line C.

Rejected device handling unit 70 is disposed to move right and left in the upper rear of stage 2, and includes a first and a second rejected device handling arms 71 and 72 which are spaced apart each other.

When a semiconductor fails a DC test in DC test unit 40, DC test unit 40 moves to the rear of stage 2, and first rejected device handling arm 71 removes the semiconductor device from DC test unit 40 and transports the device to DC rejecting tray 82 of rejecting tray unit 80. When a semiconductor device fails a burn-in test, carrier pocket unit 50 moves to rear of stage 2, and second rejected device handling arm 72 removes the semiconductor device from carrier pocket unit 50 and transports the device to burn-in rejecting tray 81 of rejecting tray unit 80.

Rejecting tray unit 80 moves back and forth, i.e., along the Y-axis, on stage 2, and first and second rejected device handling arms 71 and 72 move in a direction perpendicular to that of rejecting tray unit 80, i.e., along the X-axis, so that the semiconductor devices can be inserted in the relevant pockets of the burn-in and DC rejecting trays 81 and 82.

First and second rejected device handling arms 71 and 72 of rejected device handling unit 70 are supported and driven by a common transportation shaft 73.

First rejected device handling arm 71 removes a semiconductor device from DC test unit 40 which has moved to the rear of stage 2, and loads the device to DC rejecting tray 82. Second rejected device handling arm 72 removes a semiconductor device from carrier pocket unit 50 which has moved to the rear of stage 2 and loads the device to burn-in rejecting tray 81. As a result, rejected device handling unit 70 operates along a transporting path D to transport rejected semiconductor devices.

Meanwhile, rejected device handling unit 70 can include a single rejected device handling arm disposed to move right and left in an upper front of stage 2, instead of first and second rejected device handling arms 71 and 72.

In this case, the single rejected device handling arm removes semiconductor devices from DC test unit 40 and carrier pocket unit 50 which has moved to the rear of stage 2, and transports the devices to the rejecting tray unit 80. Rejected device handling unit 70 operates along path D to transport the rejected semiconductor devices.

Figure 3:
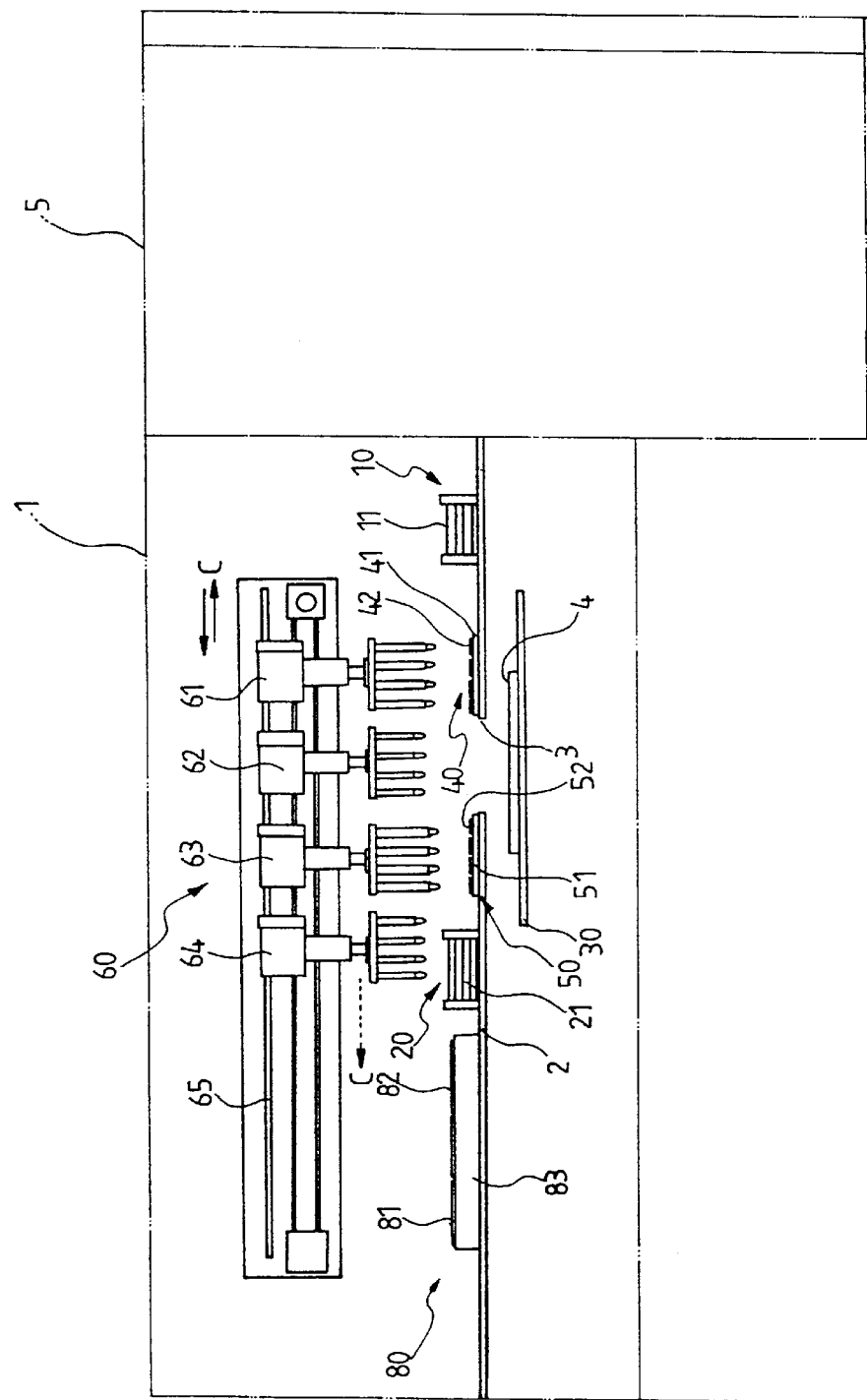
FIG. 3 is a front view of the semiconductor device handling and sorting apparatus of FIG. 2.

Referring to FIG. 3, after a burn-in test, burn-in board 4 loaded with semiconductor devices is conveyed from MBT chamber 200 by AGV 300, and loaded to burn-in board elevator 5. An apparatus controller (not shown) controls burn-in board elevator 5 to elevate burn-in board 4 to a relevant position, and loads burn-in board 4 under stage 2 of main body 1. Then, the apparatus controller controls XY-table unit 30 so that burn-in board 4 is loaded thereon, and moves XY-table 30 in the X and Y directions so that the semiconductor devices on the burn-in board 4 are accessible through opening 3.

Subsequently, third good device handling arm 63 of good device handling unit 60 removes the devices through opening 3 and inserts the devices to carrier pocket unit 50. At this time, the devices in carrier pocket unit 50 are sorted into good or rejected devices according to a burn-in test result downloaded from the server 400. If a semiconductor device loaded to carrier pocket 52 is rejected, the apparatus controller moves the carrier pocket 52 to the rear of fixed base 51.

Carrier pockets 52 can move independently one another along with guide 53 allocated to each carrier pocket 52, so that only the carrier pockets 52 having rejected devices move to the rear of fixed base 51.

Figure 4:
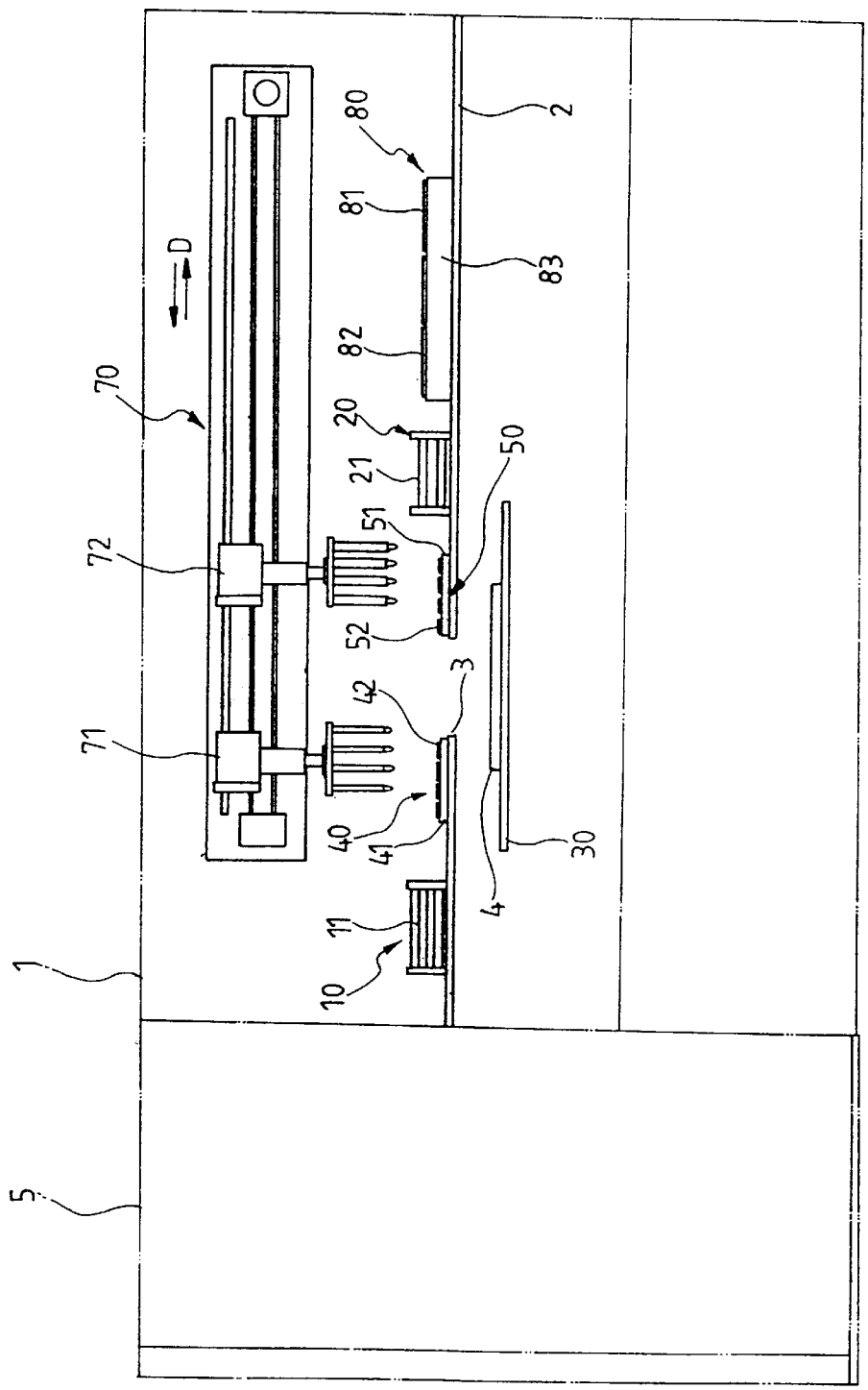
FIG. 4 is a rear view of the semiconductor device handling and sorting apparatus of FIG. 2.

Referring to FIG. 4, second rejected device handling arm 72 of rejected device handling unit 70 removes a rejected semiconductor device from the carrier pocket 52 which has moved to the rear of stage 2, and transports the device to burn-in rejecting tray 81 of rejecting tray unit 80.

Movable plate 83 moves burn-in rejecting tray 81 back and forth, i.e., in Y-axis direction, on stage 2, and second rejected device handling arm 72 moves in a direction perpendicular to the movement of rejecting tray unit 80, i.e., in X-axis direction, so that the semiconductor device can be properly loaded to the pocket of burn-in rejecting tray 81.

In contrast to the prior art, in which the burn-in rejecting trays move along X and Y axes by an XY-robot, in the present invention, the rejected semiconductor devices can be loaded to burn-in rejecting tray 81 by a combination of the movement of burn-in rejecting trays 81 and the corresponding perpendicular movement of second rejected device handling arm 72. Therefore, the rejecting tray operation is simpler in the present invention than in the prior art.

If a semiconductor device loaded in carrier pocket 52 is determined to be good, fourth good device handling arm 64 of good device handling unit 60 removes the semiconductor device from carrier pocket unit 50, and loads the device to unloading tray 21, as shown in FIG. 3. When filled with semiconductor devices unloading tray 21 is unloaded from the apparatus 1.

Figure 5:
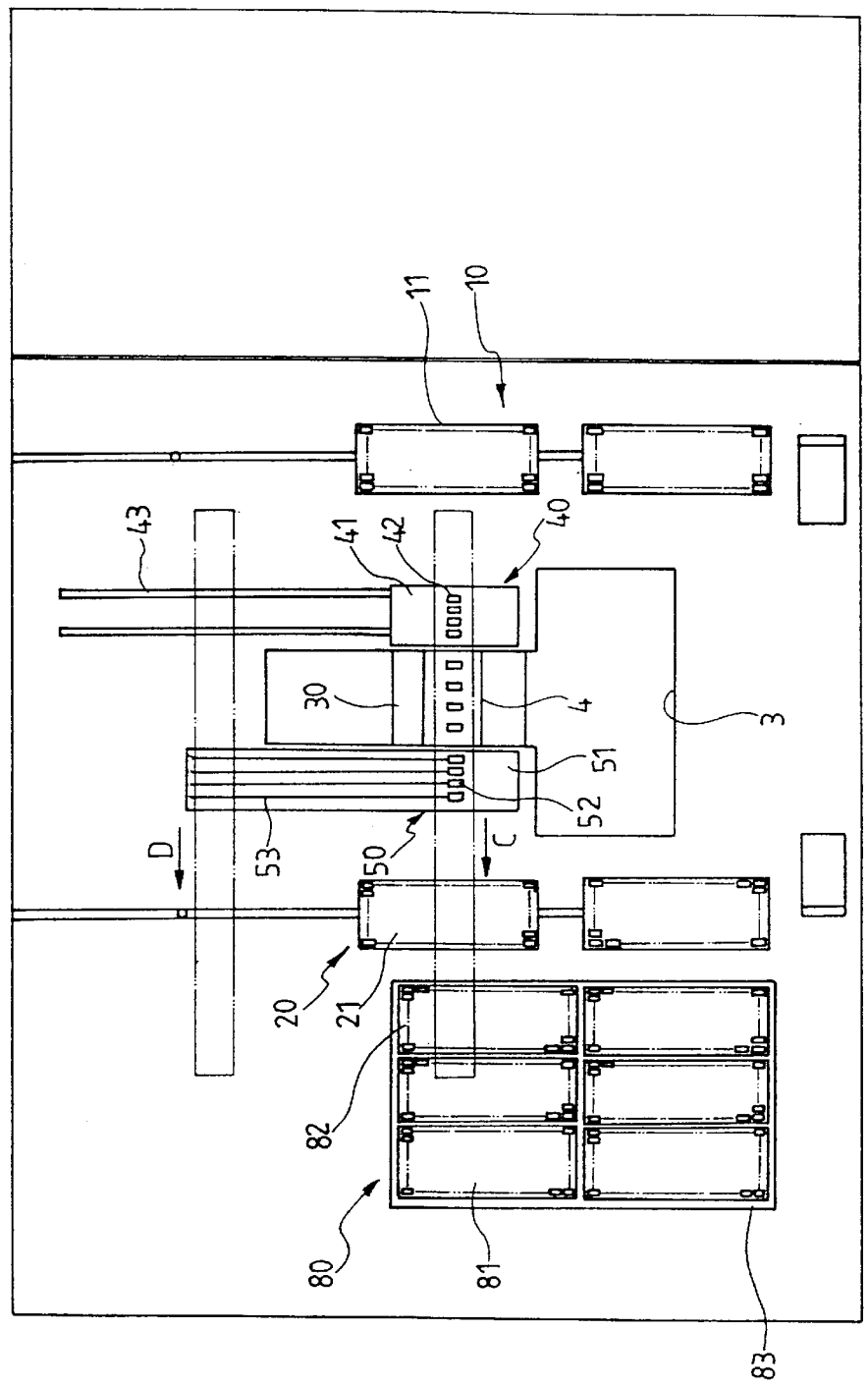
FIG. 5 is a plan view of the semiconductor device handling and sorting apparatus of FIG. 2.

Referring to FIG. 5, third and fourth good device handling arms 63 and 64 operate along transportation path C to transport good semiconductor devices, and second rejected device handling arm 72 operates along transportation path D to transport rejected semiconductor devices. Transportation paths C and D are spaced apart each other.

In contrast to a prior art where sorting semiconductor devices into good or rejected devices according to a burn-in test result is performed simultaneously along a main operation line, in the present invention, the sorting of semiconductor devices is performed along two separate operation lines C and D, so that effective sorting operation can be achieved.

As described above referring to FIG. 3, when four semiconductor devices are removed from burn-in board 4 after a burn-in test, first good device handling arm 61 picks up four semiconductor devices from loading tray 11, which contains semiconductor devices not yet DC or burn-in tested, and inserts the four devices into DC sockets 41 of DC test unit 40. A DC test controller of the apparatus performs a DC test by sending DC test signals to DC sockets 41.

After the DC test, the apparatus controller sorts the semiconductor devices of DC test unit 40 based on information transmitted from the DC test controller, and then movable base 41 of DC test unit 40 containing semiconductor devices that failed the DC test moves to the rear of the stage 2.

Referring to FIG. 4, first rejected device handling arm 71 transports the semiconductor devices of DC test unit 40 which has moved to the rear of stage 2 from DC test unit 40 to DC rejecting tray 82 of rejecting tray unit 80. As described above, DC rejecting tray 82 of rejecting tray unit 80 moves by movable plate 83 which moves back and forth on stage 2, i.e., in the Y direction, and first rejected device handling arm 71 moves in the direction perpendicular to that of rejecting tray unit 80, i.e., in the X direction.

Meanwhile, second good device handling arm 62 unloads semiconductor devices that passed the DC test from DC sockets 42 of DC test unit 40, and inserts the devices to burn-in board 4 positioned under stage 2, as shown in FIG. 3. XY-table unit 30 on which the burn-in board is loaded moves in X and Y directions so that the relevant pocket of burn-in board 4 can be accessed through opening 3.

In the prior art, aligning DC rejecting trays by employing XY-table can cause unexpected operation errors due to complicated operation instructions related to the movement in the X and Y directions. Moreover, a semiconductor device often pops out from a DC rejecting tray during aligning the DC rejecting tray due to a driving impact. In addition, another problem is that a transporting unit does not operate until the aligning of the DC rejecting tray is complete.

In the present invention, DC rejecting tray 82 of rejecting tray unit 80 operates separately from XY-table unit 30, so that XY-table unit 30 does not have to perform additional alignment for DC rejecting tray 82. As a result, the present invention can avoid the above-mentioned problems such as an erroneous operation of apparatus, pop-out of semiconductor device, and delayed operation of the device handling units 60 and 70.

Meanwhile, at the same time the second good device handling arm 62 inserts the DC tested semiconductor devices to burn-in board 4, third good device handling arm 63 unloads another four semiconductor devices from burn-in board 4. That is, when third good device handling arm 63 unloads the DC and burn-in tested semiconductor devices from burn-in board 4, second good device handling arm 62 inserts the DC tested semiconductor devices in burn-in board 4 for a burn-in test.

Referring to FIG. 5, during the sorting after a DC test, while first and second good device handling arms 61 and 62 transport good semiconductor devices along operation line C, first rejected device handling arm 71 transports rejected semiconductor devices along operation line D, which is separated from operation line C. Thus, the transportation of DC test good devices does not interfere with transportation of rejected devices.

After burn-in board 4 unloads all the burn-in tested semiconductor devices and loads all the DC tested good semiconductor devices, the apparatus controller unloads burn-in board 4 by means of burn-in board elevator 5, and AGV 300 transports burn-in board 4 to MBT chamber 200. Then, a new burn-in test starts.

In summary, the present invention can increase the effectiveness of a semiconductor device handling and sorting apparatus which is used in connection with a semiconductor burn-in process.

This invention has been described above with reference to the aforementioned embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A semiconductor device sorting apparatus comprising:
   a first unit that performs a DC test of semiconductor devices;
   a second unit that holds a burn-in board of semiconductor devices;
   a third unit on which semiconductor devices can be placed from the second unit;
   a first set of arms that move along a first line, the first set of arms transporting semiconductor devices among the first, second, and third units; and
   a second set of arms that move along a second line that is separated from the first line,
   wherein the first and the third units move to the second line so that the second set of arms can unload semiconductor devices.

2. The apparatus of claim 1, wherein the first unit can move between the first and the second lines.

3. The apparatus of claim 1, wherein the second unit is disposed along the first line.

4. The apparatus of claim 1, wherein the third unit can move between the first and the second lines.

5. A semiconductor device sorting apparatus comprising:
   a main body having a stage and an opening on the stage; and
   a burn-in board elevator, which carries a burn-in board up and down and moves the burn-in board to and from under the opening, wherein the main body comprises:
   a loading terminal unit disposed on a front portion of the stage, the loading terminal unit being loaded with loading trays which contain semiconductor devices;
   an unloading terminal unit disposed on a front portion of the stage, wherein the unloading terminal unit is separated from the loading terminal unit by the opening and loaded with unloading trays;

a DC test unit disposed between the opening and the loading terminal unit, the DC test unit being movably mounted to move forward and back on the stage, wherein the DC test unit DC tests the semiconductor devices loaded thereto from the loading trays;

an XY-table unit disposed under the opening, the XY-table unit moving in X and Y directions so as to expose a portion of a burn-in board on the XY-table through the opening;

a carrier pocket unit disposed between the opening and the unloading terminal unit, the carrier pocket unit being movably mounted to move forward and back on the stage, the carrier pocket unit determining whether the semiconductor devices loaded thereon are within a specification;

a rejecting tray unit disposed next to the unloading terminal unit, the rejecting tray unit moving forward and back on the stage to receive rejected semiconductor devices;

a good device handling unit disposed to move above an upper front side of the stage, wherein the good device handling unit loads or unloads the semiconductor devices to or from the loading tray, the DC test unit, the burn-in board, the carrier pocket unit, and the unloading tray; and a rejected device handling unit disposed above an upper rear side of the stage so as to move perpendicularly to a direction in which the rejecting tray moves, the rejected device handling unit transporting the semiconductor devices to the rejecting tray unit.

6. The apparatus according to claim 5, wherein the DC test unit comprises:

a movable base which moves forward and back along a guide formed on the stage; and a plurality of DC sockets fixed on the movable base, wherein the DC test sockets hold the semiconductor devices for a DC test.

7. The apparatus according to claim 6, wherein the movable base moves to a rear side of the stage along the guide if any of the semiconductor devices loaded on the DC test sockets fails the DC test.

8. The apparatus according to claim 6, wherein four DC sockets are fixed to the movable base.

9. The apparatus according to claim 5, wherein the carrier pocket unit comprises:

a fixed base fixed on the stage; and a plurality of carrier pockets mounted on the fixed base so as to move front and back along a guide formed on the fixed base, wherein the carrier pockets are loaded with the semiconductor devices that have undergone a burn-in test, and move depending on whether the burn-in tested semiconductor devices passed the burn-in test.

10. The apparatus according to claim 9, wherein the carrier pockets move to a rear side of the fixed base along the guide if the semiconductor device loaded in the carrier pockets did not pass the burn-in test.

11. The apparatus according to claim 10, wherein each of the carrier pockets moves independently.

12. The apparatus according to claim 9, wherein four carrier pockets are fixed on the fixed base.

13. The apparatus according to claim 5, wherein the good device handling unit comprises:

a first good device handling arm, which transports the semiconductor devices from the loading tray to the DC test unit;

a second good device handling arm, which transports the semiconductor devices from the DC test unit to the burn-in board;

a third good device handling arm, which transports the semiconductor devices from the burn-in board to the carrier pocket unit; and a fourth good device handling arm, which transports the semiconductor devices from the carrier pocket unit to the unloading tray.

14. The apparatus according to claim 13, wherein the first to fourth good product handling arms are supported and driven by a common transportation shaft.

15. The apparatus according to claim 13, wherein the second good product handling arm transports the semiconductor devices from the DC test unit to the burn-in board only if the semiconductor devices pass a DC test in the DC test unit.

16. The apparatus according to claim 13, wherein the fourth good device handling arm transports the semiconductor devices from the carrier pocket unit to the unloading tray only if the semiconductor devices in the carrier pocket unit pass a burn-in test.

17. The apparatus according to claim 5, wherein the rejected device handling unit comprises:

a first rejected device handling arm which moves right and left in an upper rear side of the stage and transports the semiconductor devices from the DC test unit to the rejecting tray unit when the DC test unit moves to a rear side of the stage; and a second rejected device handling arm which moves right and left in an upper rear side of the stage and transports the semiconductor devices from the carrier pocket unit to the rejecting tray unit when the carrier pocket unit moves to a rear side of the stage.

18. The apparatus according to claim 17, wherein the first and second rejected device handling arms are supported and driven by a common transportation shaft.

19. The apparatus according to claim 5, wherein the rejected device handling unit has a single rejected device handling arm which moves right and left in an upper rear side of the stage, transports the semiconductor devices from the DC test unit to the rejecting tray unit when the DC test unit moves to a rear side of the stage, and transports the semiconductor devices from the carrier pocket unit to the rejecting tray unit when the carrier pocket unit moves to a rear side of the stage.

20. The apparatus according to claim 5, wherein the rejecting tray unit comprises:

a movable plate disposed on the stage so as to move forward and back on said stage;

a burn-in rejecting tray disposed on the movable plate to receive the semiconductor devices from the rejected device handling unit; and a DC rejecting tray disposed on the movable plate to receive the semiconductor devices from the rejected device handling unit.

* * * * *